United States Patent [19]

Aitchison

[11] Patent Number: 4,885,483
[45] Date of Patent: Dec. 5, 1989

[54] LOGARITHMIC AMPLIFIER
[75] Inventor: Colin S. Aitchison, Redhill, England
[73] Assignee: ERA Patents Limited, Leatherhead, England
[21] Appl. No.: 321,507
[22] Filed: Mar. 9, 1989
[30] Foreign Application Priority Data Mar. 10, 1988 [GB] United Kingdom ............... 8805672

[51] Int. Cl.[4] .............................................. G06G 7/24
[52] U.S. Cl. ................................ 307/492; 328/145; 329/354; 330/54
[58] Field of Search ............... 330/54, 277; 307/492; 328/145; 329/101, 146, 192; 455/337, 341

[56] References Cited
U.S. PATENT DOCUMENTS 3,668,535  6/1972  Lansdowne ............... 307/492 X Primary Examiner—James B. Mullins
Attorney, Agent, or Firm—Jeffers, Hoffman & Niewyk

[57] ABSTRACT

Logarithmic amplifiers which have a logarithmic transfer characteristic may be used in microwave instrumentation. Such an amplifier includes a series of MESFET distributed amplifiers (DA1-DA8) connected in cascade, with each of the MESFET distributed amplifiers (DA1-DA8) having a gate transmission line (G1-G8) and a drain transmission line (D1-D8) which share a common ground or source line (5), and a number of MESFETs (1-4) connected in parallel with their gate electrodes (g) connected at spaced intervals along the gate transmission line (G1-G8) their drain electrodes (d) connected at spaced intervals along the drain transmission line (D1-D8) and their source electrodes (s) connected to the source line (5). A low pass filter (LPF1-LPF8) is connected to the downstream end of the gate transmission line (G1-G8) of each distributed amplifier (DA1-DA8) with each low pass filter (LPF1-LPF8) passing only the rectified component of the travelling wave passing along each gate transmission line (G1-G8). A summer (OP1) is connected to the outputs of each of the low pass filters (LPF4-LPF8) to sum them and provide an output (O/P) which provides the output of the logarithmic amplifier.

8 Claims, 3 Drawing Sheets

LOGARITHMIC AMPLIFIER

BACKGROUND OF THE INVENTION

Logarithmic amplifiers which are amplifiers having a logarithmic transfer characteristic, are used widely and one example of their use is in microwave instrumentation.

At present logarithmic amplifiers comprise a number of amplifiers having a linear characteristic connected sequentially via hybrid couplers. Each of the hybrid couplers is connected to a demodulator for demodulating an amplitude modulated signal and these are commonly known as video detectors. The outputs from all of the demodulators are then summed to provide the logarithmic output of the amplifier.

It is also known to use a single amplifier with a linear characteristic and then to apply the output of the linear amplifier to a demodulator for demodulating an amplitude modulated signal with the demodulator itself having a logarithmic transfer characteristic so that the output from the demodulator provides the logarithmic output from the amplifier.

Conventional linear amplifiers for operating at microwave frequencies usually include both a resonant input stage and a resonant output stage and accordingly they, and any resulting logarithmic amplifier including them, only has a limited bandwidth. This gives rise to difficulties when the resulting logarithmic amplifiers are required to handle short pulses for which a large bandwidth is required. Amplifiers capable of operating at microwave frequencies are expensive and previous attempts to improve their bandwidth have resulted in the further increase in their cost.

SUMMARY OF THE INVENTION

According to this invention a logarithmic amplifier comprises a series of MESFET distributed amplifiers connected in cascade, each of the MESFET distributed amplifiers having a gate transmission line and a drain transmission line which share a common ground or source line, a number of MESFETs connected in parallel with their gate electrodes connected at spaced intervals along the gate transmission line, their drain electrodes connected at spaced intervals along the drain transmission line and their source electrodes connected to the source line; a low pass filter connected to the downstream end of the gate transmission line of each distributed amplifier, each low pass filter passing only the rectified component of the travelling wave passing along each gate transmission line; and, a summer connected to the outputs of each of the low pass filters to sum them and provide an output, the output of the summer providing the output of the logarithmic amplifier.

As a signal input into the first of the distributed amplifiers passes through the series of distributed amplifiers it is increased in level until saturation occurs in one of them. For a gradually increasing input signal it is the final distributed amplifier which saturates first, followed in turn by the penultimate, the antepenultimate and so on. Once saturation occurs the output of that amplifier is invariant. The cause of saturation is that the gate source diode of the MESFETs in the distributed amplifier, initially the final one, and subsequently the other ones, operates non-linearly. Thus the signal level of the signal carried by that MESFET is sufficient to drive its gate source junction into conduction. Thus the gate source junction rectifies and produces a rectified output on the gate transmission line. This rectified output is DC for a constant carrier wave and a demodulated signal for an amplitude modulated carrier wave. The rectified output is invariant once the amplifier has been driven into saturation. Prior to saturation no rectification and therefore no d.c. or demodulated signal appears across the gate source diode. The invariant output of the or each distributed amplifier passes through its or their associated low-pass filters and are then summed in the summer to provide the output from the logarithmic amplifier.

Preferably the gate transmission line of each distributed amplifier includes decoupling capacitors between the transmission line and impedance matching loads connected to the ends of each gate transmission line and, in this case, the low pass filter is connected to the downstream end of each gate transmission line immediately upstream of the decoupling capacitor. The low pass filter may be formed by a simple L-C circuit to pass only a low frequency component corresponding to an amplitude modulation applied to the signal carried by the gate transmission line. The summer is preferably formed by a multi-input operational amplifier having the outputs from each of the low pass filters connected to its inputs.

MESFET distributed amplifiers have a very broad bandwidth and accordingly a logarithmic amplifier in accordance with this invention is capable of handling pulses having a very short rise time of the order of tens of picoseconds. GaAs MESFET distributed amplifiers capable of handling signals from 20 MHz to 50 GHz are relatively cheap and can be readily formed as a monolithic integrated circuit or a hybrid integrated circuit in which all of the components are manufactured separately and then mounted on a microwave substrate.

The number of distributed amplifiers connected in cascade depends upon the required dynamic range of the logarithmic amplifier. Typically distributed amplifiers including, for example, four GaAs MESFETs have a gain of between 6 and 10 dB. Thus, for a logarithmic amplifier to have a dynamic range of 70 dB, 7 to 12 distributed amplifiers are connected together in cascade. Typically 8 or 9 amplifiers are connected together.

BRIEF DESCRIPTION OF THE DRAWINGS

A particular example of a logarithmic amplifier in accordance with this invention will now be described with reference to the accompanying drawings, in which.

DESCRIPTION OF PREFERRED EXAMPLES

This example of a logarithmic amplifier includes eight distributed amplifiers DA1 to DA8 connected together in cascade. Each distributed amplifier DA1 to DA8 has the downstream end of its gate transmission line connected to low pass filters LP1 to LP8 and the outputs of these are connected to a summer OP1.

Each distributed amplifier includes four GaAs MESFETs 1 to 4 with their gate electrodes connected to a gate transmission line G, their drain electrodes connected to a drain transmission line D and their source electrodes connected to a ground plane 5. An input 6 to the first distributed amplifier DA1 forms the input to the logarithmic amplifier.

Figure 2:
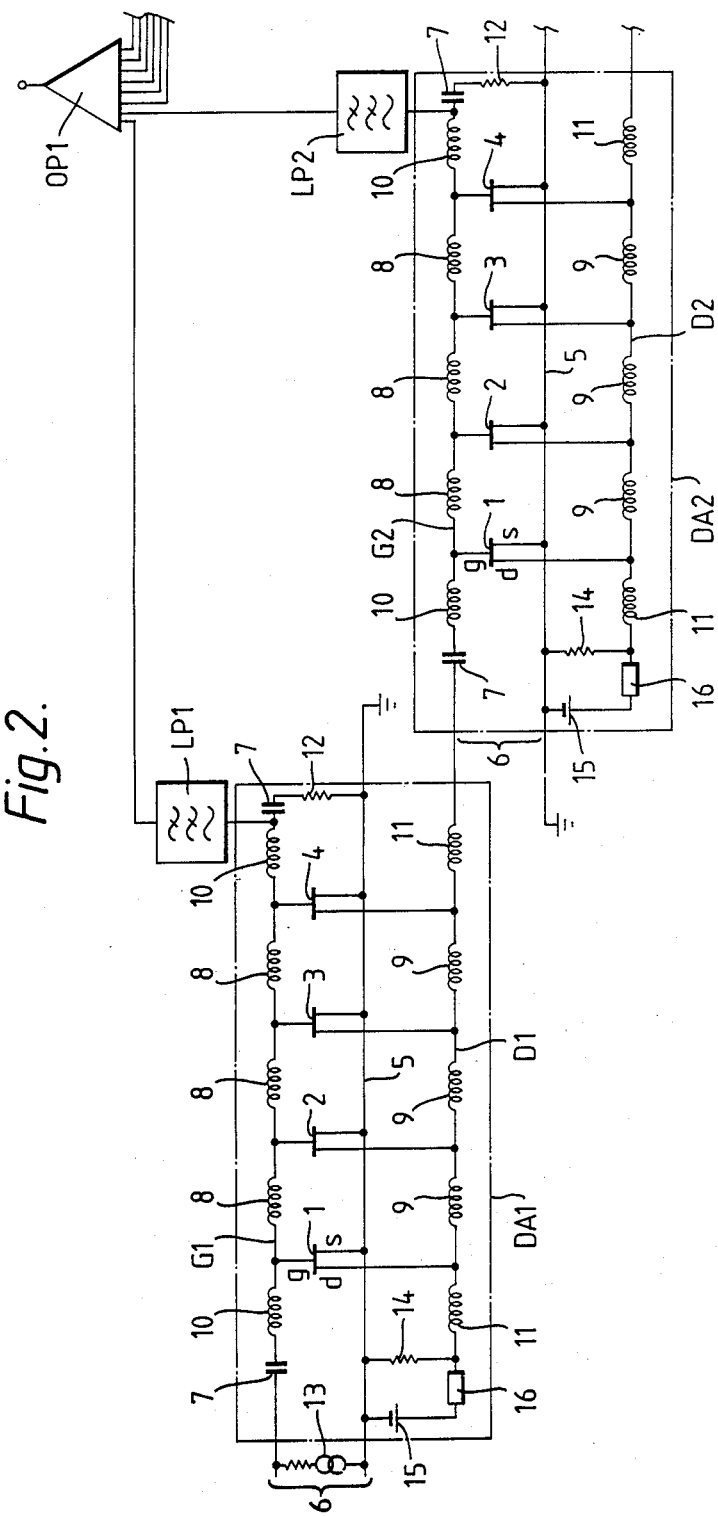
FIG. 2 is a circuit diagram of part of the logarithmic amplifier showing the construction of the first and second distributed amplifier.

The gate transmission lines G include decoupling capacitors 7, inductors 8 connected between the gate electrodes of successive transistors 1, 2, 3 and 4 and inductors 10 in the end sections of the line. The drain transmission line D includes inductors 9 connected between the drain electrodes of adjacent transistors 1, 2, 3 and 4 and inductors 11 in the end sections of the line. The gate transmission line G is terminated at its downstream end, the right hand end, as seen in FIG. 2, by a resistor 12 which matches the characteristic impedance of the line. The left hand side of the gate transmission line is terminated by a generator 13 whose signal is to be amplified and which has a source impedance equal to the gate line characteristic impedance. The drain transmission line D includes at its left hand end a resistor 14 matching the characteristic impedance of the line. A DC source 15 is connected to the source line 5 and to the junction of the resistor 14 and adjacent inductor 11 via a low pass filter 16 to provide bias, typically reverse bias, for the drain electrodes of the transistors 1 to 4.

In use a microwave signal fed into the input 6 by the generator 13 is amplified by the successive transistors 1 to 4. Typically with four transistors a gain of 6 dB is obtained in each distributed amplifier. The travelling wave moving along the gate transmission line G is picked off at a node between the inductor 10 and the decoupling capacitor 7 and fed to a low pass filter LP1 to LP8. These low pass filters allow only low frequency and d.c components to pass through. The outputs from the low pass filters LP1 to LP8 are fed to eight adding inputs of a summer formed by an operational amplifier OP1.

The right hand end of the drain transmission line D of distributed amplifier DA1 is connected across the input 6 of distributed amplifier DA2 to connect the amplifiers DA1 and DA2 in cascade. This connection is repeated throughout all of the stages. All of the distributed amplifiers DA1 to DA8 and low pass filters LP1 to LP8 are similar except that the right hand end of the drain transmission line D8 in distributed amplifier DA8 is terminated by an impedance matching resistor (not shown) the resistance of which matches the characteristic impedance of that of the drain transmission line D.

As the microwave signal fed into the distributed amplifier DA1 passes through the cascaded amplifiers DA1 to DA8 its amplitude increases in each distributed amplifier until saturation of one or of one MESFET in one of the amplifiers occurs. With a very small input microwave signal saturation will occur in amplifier DA8 and with the smallest signal, saturation only of MESFET 4 in amplifier DA8. As the input signal level increases more MESFETs in more amplifiers are saturated. Consider a typical case where saturation occurs in at least one of the MESFETs 1 to 4, in amplifier DA6. MESFET 4 saturates first and operates non-linearly because the gate source diode of this MESFET has been driven into conduction. Under these conditions the gate source junction at least partly rectifies the microwave signal travelling along the gate transmission line G to produce a demodulated signal consisting of a demodulated signal corresponding to the amplitude modulation on the signal and a d.c. component corresponding to the rectified carrier wave signal. The frequency of the demodulated signal is much lower than that of the microwave signal and this and the d.c. component is passed by the low-pass filter LPF6 to the summer OP1. Similarly the rectified and demodulated signals from the distributed amplifiers DA7 and DA8 are passed by the low-pass filters LPF7 and LPF8, and all are then summed in summer OP1 to provide the logarithmic output log o/p.

Figure 3:
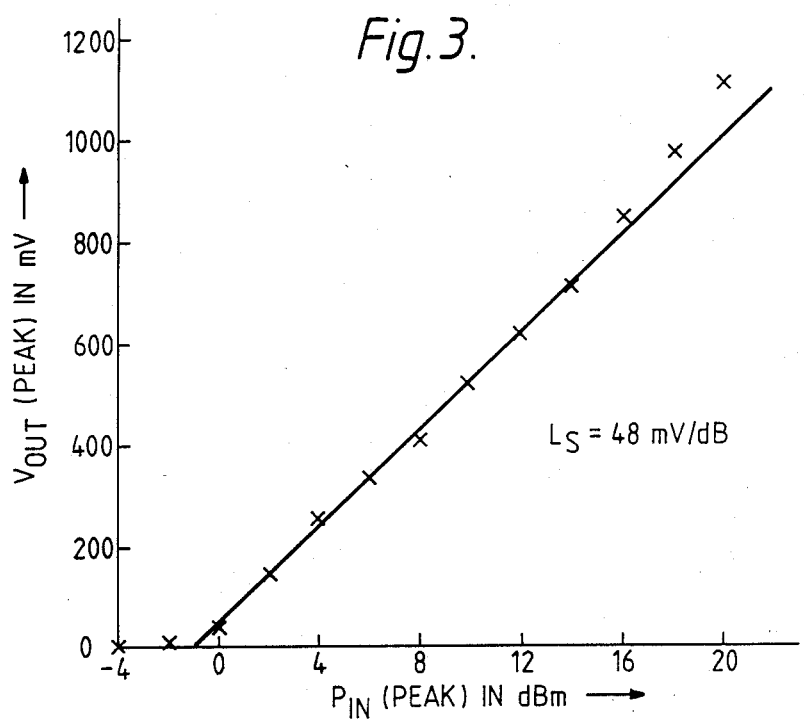
FIG. 3 is a graph of output voltage against input power.
Figure 4:
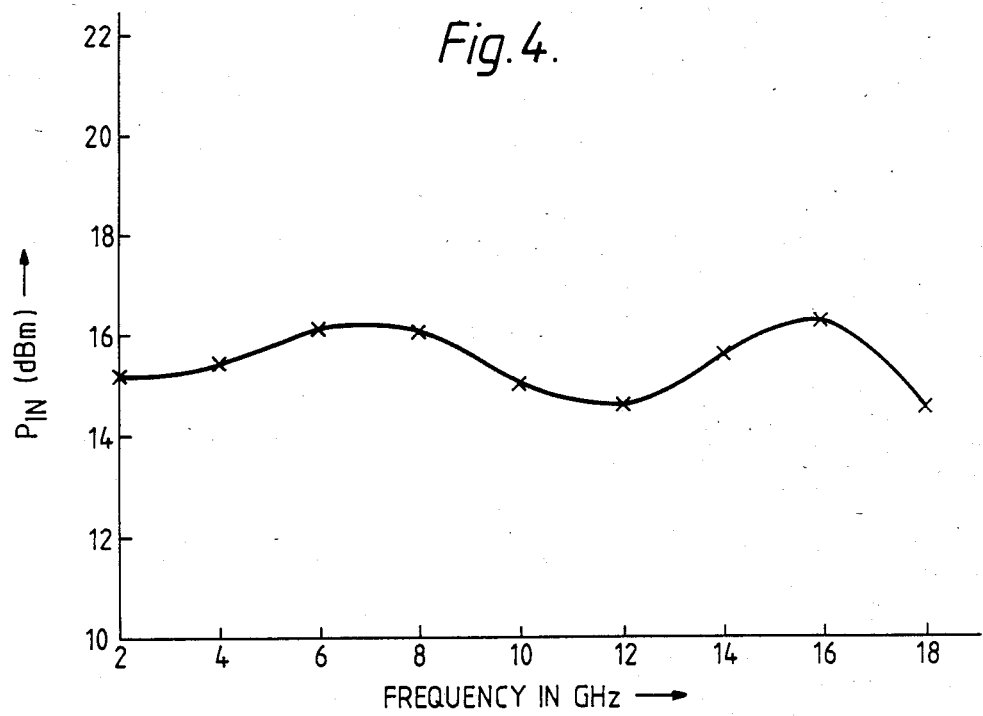
FIG. 4 is a graph of input power against frequency.

FIGS. 3 and 4 illustrate the output of a simple three stage demonstration logarithmic amplifier in accordance with this invention. FIG. 3 is a graph of the peak output voltage against the input power in dB illustrating the performance of the amplifier at a frequency of 8 GHz with a pulse width of 2 microseconds and a pulse repetition frequency of 100 KHz. FIG. 4 illustrates the variation in the input power required to give a constant output of 200 mV with frequency over a frequency range from 2 to 18 GHz and shows that, over this frequency range the logarithmic transfer function is substantially constant.

Figure 1:
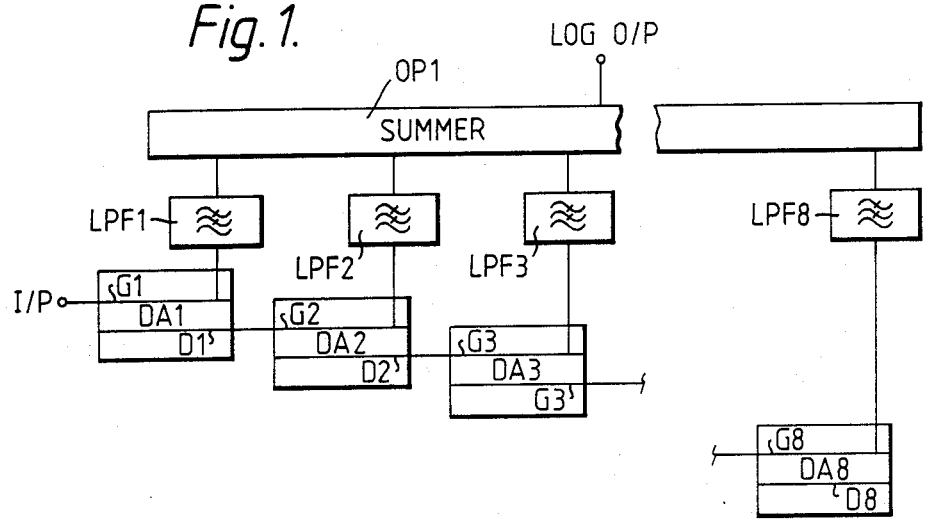
FIG. 1 is a block diagram of the logarithmic amplifier.
Figure 5A:
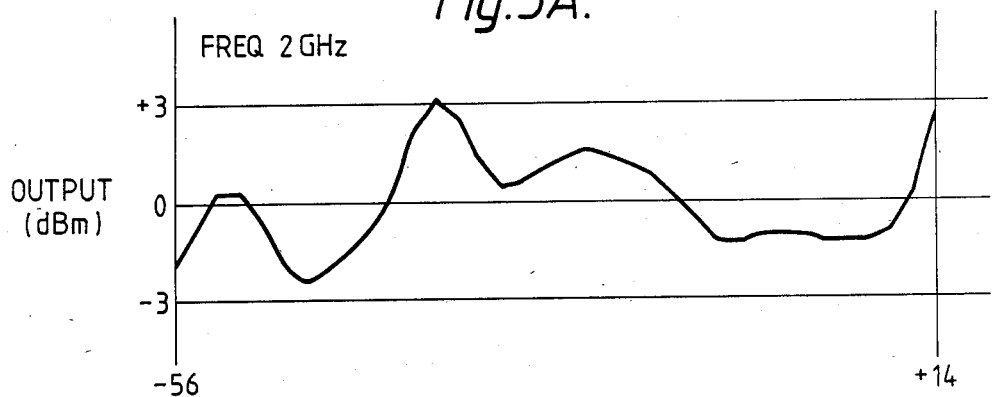
FIGS. 5A and 5B are graphs illustrating the linearity of a nine module log amplifier operating at 2 GHz and 4 GHz respectively.
Figure 5B:
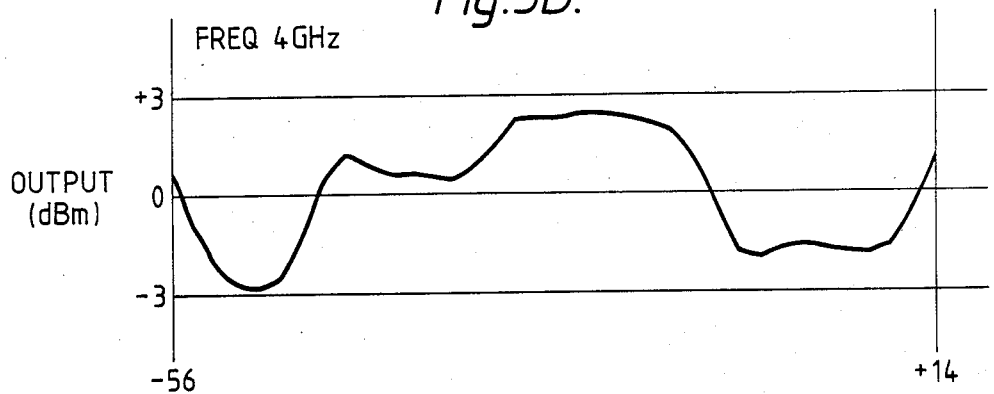

FIGS. 5A to 5B illustrate the linearity of a nine module log amplifier in accordance with this invention over a dynamic range of 70 dB at operating frequencies of 2 and 4 GHz, respectively.

I claim:

1. In a logarithmic amplifier comprising a series of MESFET distributed amplifiers connected in cascade, each of said MESFET distributed amplifiers having a gate transmission line a drain transmission line a common ground line, a plurality of MESFETs connected in parallel, gate electrodes of said MESFET being connected at spaced intervals along said gate transmission line, drain electrodes of said MESFETs being connected at spaced intervals along said drain transmission line and source electrodes of said MESFETs being connected to said ground line;

the improvement wherein said logarithmic amplifier also includes low pass filter means operatively connected to said gate transmission line of each distributed amplifier, said low pass filter means passing only a rectified component of said travelling wave passing along each gate transmission line, and summer means connected to said low pass filter means to provide an output, said summer providing an output of said logarithmic amplifier.

2. The logarithmic amplifier of claim 1, also including impedance matching loads connected to ends of each gate transmission line wherein said gate transmission line of each said distributed amplifier includes decoupling capacitors operatively connected between said transmission line and said impedance matching loads and, wherein said low pass filter means is connected to said gate transmission lines immediately before said decoupling capacitor.

3. The logarithmic amplifier of claim 1, wherein each said low pass filter means is formed by a circuit to pass only a low frequency component corresponding to an amplitude modulation and d.c. component of a signal carried by each gate transmission line.

4. The logarithmic amplifier of claim 1, wherein said summer means is formed by a multi-input operational amplifier having outputs from each of said low pass filter means connected to its inputs.

5. The logarithmic amplifier of claim 1, wherein each of said distributed amplifiers connected in cascade includes four GaAs MESFETS.

6. The logarithmic amplifier of claim 5, wherein eight of said distributed amplifiers are connected together in cascade.

7. The logarithmic amplifier of claim 1, wherein said MESFETs are GaAs MESFETs.

8. The logarithmic amplifier of claim 1, wherein said distributed amplifiers are capable of handling microwave signals having a frequency in a range from 20 MHz to 50 GHz.

* * * * *